United States Patent [19]
Tran et al.

[11] Patent Number: 5,157,277
[45] Date of Patent: Oct. 20, 1992

[54] CLOCK BUFFER WITH ADJUSTABLE DELAY AND FIXED DUTY CYCLE OUTPUT

[75] Inventors: Thanh T. Tran, Tomball; David G. Abdoo, Spring, both of Tex.

[73] Assignee: Compaq Computer Corporation, Houston, Tex.

[21] Appl. No.: 635,721

[22] Filed: Dec. 28, 1990

[51] Int. Cl.$^5$ .......................... H03K 5/13; H03K 5/04
[52] U.S. Cl. ..................................... 307/269; 307/262; 307/265; 328/63; 328/155
[58] Field of Search .............. 307/260, 265, 262, 269, 307/354, 360, 362, 603, 600; 328/155, 63, 72; 331/1 A, 17

[56] References Cited

U.S. PATENT DOCUMENTS

| | | | |
|---|---|---|---|
| 4,494,021 | 1/1985 | Bell et al. | 307/591 |
| 4,737,724 | 4/1988 | Porrot | 307/262 |
| 4,837,464 | 6/1989 | Viscardi et al. | 328/155 |
| 4,864,160 | 9/1989 | Abdoo | 307/269 |

OTHER PUBLICATIONS

Johnson et al., "A Variable Delay Line PLL for CPU-Coprocessor Synchronization", *J. Solid State Circuits*, vol. 23, No. 5, (IEEE, Oct. 1988), pp. 1218-1223.
Jeong et al., "Design of PLL-Based Clock Generation Circuits", *J. Solid State Circuits*, vol. SC-22, No. 2, (IEEE, Apr. 1987), pp. 255-261.

*Primary Examiner*—Timothy P. Callahan
*Attorney, Agent, or Firm*—Vinson & Elkins

[57] ABSTRACT

A clock buffer circuit for a computer system, and a computer system incorporating the same, are disclosed. The clock buffer circuit includes a differential input buffer for receiving the input clock signal, with its output coupled to the input of a phase locked loop (PLL). The switching level of the differential input buffer is adjustable, either by adjusting the DC bias applied to the input clock signal, or by adjusting the reference signal, which changes the point in the cycle of the input clock signal at which the differential buffer switches. The PLL synchronizes its output to an edge of the output of the differential buffer, but maintains the same duty cycle (e.g., 50%). Accordingly, the clock buffer circuit may have its delay adjusted, by modifying a voltage divider, applying a variable voltage, or programmably via a digital-to-analog converter, to match the delays of other clock buffer circuits in the computer system, reducing the clock skew in the system. A sine wave may be used as the input clock signal, so that harmonic noise is reduced in the system.

25 Claims, 3 Drawing Sheets

CLOCK BUFFER WITH ADJUSTABLE DELAY AND FIXED DUTY CYCLE OUTPUT

This invention is in the field of high speed computer circuits, and is more specifically directed to clock buffer circuits.

BACKGROUND OF THE INVENTION

As modern computer systems operate at increasingly higher speeds, the timing control signals communicated within the system must accordingly improve in accuracy. For many computer systems, particularly those which are microprocessor-based, the clock signal applied to the central processing unit, and other circuitry operating synchronously therewith, is preferably free from harmonic and other noise. Since signal noise is primarily due to parasitic inductance, the increase in signal switching speed required in high speed computers will also increase the amount of noise present on the signal. In addition, while propagation delays of the clock signal as it is communicated through buffers and other circuitry cannot be avoided, it is highly desirable that such delays be controllable and uniform.

Copending application Ser. No. 444,116, filed Nov. 30, 1989, assigned to Compaq Computer Corporation, and incorporated herein by this reference, describes a clock signal distribution scheme having reduced harmonic noise. In this scheme, the clock signal is distributed around the computer system as a sine wave rather than a square wave, so that over much of the length of the signal transmission paths in the system, the generation of harmonic noise is much reduced. At a location near a circuit which is controlled by the clock signal, such as a microprocessor, a clock squaring circuit is provided which receives the sine wave clock signal, and forms it into a square wave to which the clocked circuit can respond.

In a system constructed according to this arrangement, not only is the microprocessor controlled by the clock signal, but other circuits are also controlled by the same clock signal in order to operate synchronously therewith. Such other circuits may include memory controllers, co-processor circuits, and the like. As described in said application Ser. No. 444,116, a clock squaring circuit, or buffer, is thus provided physically near each circuit which is to be controlled by the same clock signal, with the sine wave clock signal communicated throughout the system to each of the circuits.

Particularly where such a system is to operate at increasingly higher speeds, the synchronization of the receipt of the clock signal by each clocked circuit becomes more critical. It has been observed that, for example in the arrangement described in said application Ser. No. 444,116, the propagation delays through individual clock squaring buffers vary, buffer to buffer, by on the order of 4 nsec. As is well known for integrated circuits generally, this variation in propagation delays is due to variables in the integrated circuit manufacturing process which affect parameters such as the gains, threshold voltages, and other transistor parameters, and also the values of impedances such as resistors and capacitors therein. Variation in the propagation delays may cause system inaccuracies or failures; in systems where the clock signal frequency is on the order of 33 to 66 MHz, small variations in propagation delays may be sufficient to cause such errors.

The variations in propagation delays may be reduced by measuring propagation delays of the individual buffer circuits, and matching buffers with similar propagation delays for use in the same computer system. Such matching is, at best, inconvenient in the manufacturing and maintenance of the computer systems.

It is therefore an object of this invention to provide a clock buffer circuit which allows for adjustment of the propagation delay therethrough.

It is a further object of this invention to provide such a circuit where the duty cycle of the buffer output remains fixed over the adjustment range of the propagation delay.

It is a further object of this invention to provide such a circuit which can receive a sine wave input and produce a square wave output.

Other objects and advantages of the invention will be apparent to those of ordinary skill in the art having reference to the following description together with the drawings.

SUMMARY OF THE INVENTION

The invention may be incorporated into a clock buffer circuit which has, as a first stage, a buffer with an adjustable switching level. A phase locked loop is provided as a second stage in the buffer, which receives the output of the adjustable buffer and generates a square wave with the desired duty cycle at its output. Since the phase locked loop responds to one point in the input cycle in generating its output, adjustment of the buffer switching level provides adjustment of the delay of the phase locked loop output, without affecting the duty cycle of the output.

DETAILED DESCRIPTION OF THE PREFERRED EMBODIMENT

Figure 1:
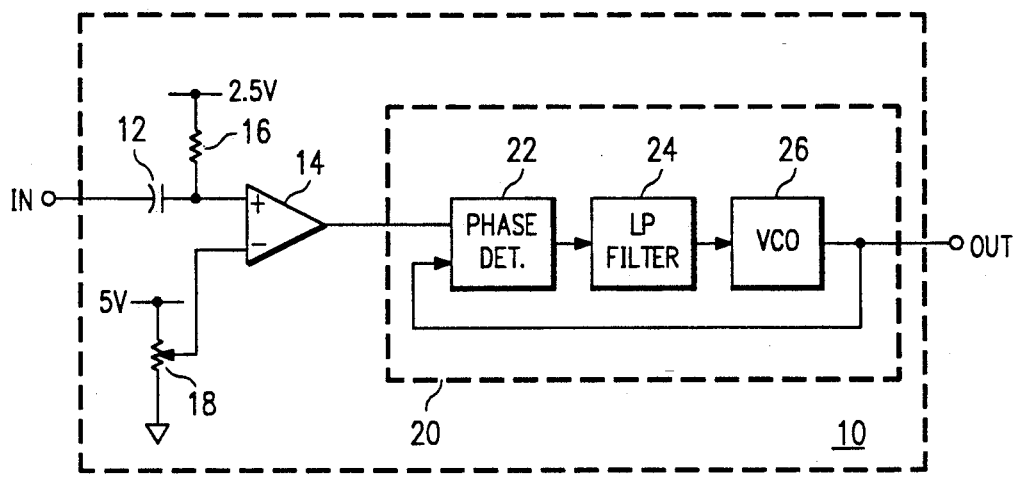
FIG. 1 is an electrical diagram, in schematic form, of a clock buffer circuit according to the preferred embodiment of the invention.

Referring now to FIG. 1, clock buffer circuit 10 according to the preferred embodiment of the invention will now be described. Clock buffer circuit 10 receives, at terminal IN, an input clock signal. The input clock signal is, in this example, a sine wave clock signal. As described in said copending application Ser. No. 444,116, use of a sine wave clock signal for distribution throughout a computer system provides the advantages of reduced harmonic noise relative to a square wave clock signal. Also in this example, clock buffer circuit 10 provides a square wave clock signal at its output terminal OUT; in this example, the duty cycle of the square wave at terminal OUT is approximately 50%, and remains so regardless of adjustments to the propagation delay, as will be described hereinbelow. Accordingly, clock buffer circuit 10 is particularly useful in buffering the sine wave clock signal into a square wave clock signal as in the system described in said application Ser. No. 444,116, and as such is preferably implemented into the computer system as closely to the clocked circuit receiving the output clock signal as possible.

It should be noted, however, that the advantage of clock buffer circuit 10 in providing adjustable delay clock signals with fixed duty cycle will also occur when the input signal received at terminal IN is other than a sine wave, for example a square wave, sawtooth wave, triangular wave, or any other type of periodic clock signal. As noted hereinabove, however, the advantages of sine wave clock signal distribution noted in said co-pending application Ser. No. 444,116 are best obtained by use of a sine wave signal to clock buffer circuit 10.

Terminal IN is received at one plate of capacitor 12, which has its other plate connected to the non-inverting input of differential buffer 14, and also to a pull-up resistor 16. Pull-up resistor 16 pulls up the non-inverting input of buffer 14 to an intermediate voltage, for example on the order of 2.5 volts. According to this construction, terminal IN is capacitively coupled to the non-inverting input of buffer 14, such that any DC component of the input clock signal is filtered from application to buffer 14. A suitable value for capacitor 12, where the frequency of the input signal is on the order of 16.5 MHz, is on the order of 0.1 $\mu F$. The provision of pull-up resistor 16 offsets the input clock signal to the intermediate voltage; the value of resistor 16 is preferably on the order of 1 kOhm. In this example, a 1.0 kOhm resistor 16 and 0.1 $\mu F$ capacitor 12 forms a high pass filter with a $-3$ dB corner frequency of approximately 1.6 kHz. The frequency of the input clock signal should be higher than the corner frequency of the high pass filter of resistor 16 and capacitor 12.

The inverting input of buffer 16 is connected to a variable reference 18, which is biased between a power supply voltage, for example on the order of 5.0 volts, and ground. It should be noted that the DC bias applied to the non-inverting input of buffer 14 is within the range of the voltage which variable reference 18 applies to the inverting input of buffer 14. Variable reference 18 thus controls the trip voltage, or switching level, of buffer 14. Accordingly, the resistance value of variable reference 18 determines the propagation delay through clock buffer circuit 10, and thus provides the ability to adjust the same, as will be described in further detail hereinbelow.

Variable reference 18 may be implemented as any one of a number of possible conventional ways. For example, variable reference 18 may be formed of a resistor ladder with variable tap points, or of a voltage divider formed of two potentiometers with the output at the node therebetween connected to the inverting input of buffer 14. Alternatively, since the value of resistance of variable reference 18 preferably remains fixed after an initial adjustment for the values of the components used in clock buffer circuit 10, variable reference 18 may be constructed as a voltage divider, where each side of the node connected to the inverting input of buffer 18 includes multiple resistors of varying values. For example, binary weighted sets of resistors may be provided both between the power supply node and the output, and between the output and ground; trimming of particular resistors out of the circuit thus can allow setting of the voltage applied to the inverting input of buffer 14 to a high degree of resolution. Further in the alternative, an active amplifier, for example a transistor having a pull-up resistor, may be used as variable reference 18. Further in the alternative, a variable regulated voltage may be directly applied to the inverting input of buffer 14, instead of using a variable reference 18, if the delay of clock buffer circuit 10 is desired to be controlled in real-time.

Differential buffer 14 is preferably constructed so that it presents a square wave output, with the value of the output depending upon the relative polarities of its inputs. For example, where the non-inverting input receives a higher voltage than its inverting input, buffer 14 outputs a high level signal; when the voltage at the inverting input is higher than at the non-inverting input, buffer 14 outputs a low level signal. The particular voltages by which buffer 14 communicates the relative polarity at its inputs depends upon the circuit type connected thereto; for example, if TTL levels are to be used in the remainder of clock buffer circuit 10, buffer 14 preferably presents its output at TTL specification levels. An example of a integrated circuit useful as buffer 14 in this embodiment of the invention is the ECL to TTL translator manufactured and sold by Motorola under part number MC10125.

The output of buffer 14 is applied to the input of phase locked loop (PLL) 20. An example of an integrated circuit useful as PLL 20 is the low skew PLL clock driver manufactured and sold by Motorola under the part number MC 88915. PLL 20 includes a phase detection circuit 22 which receives the output of buffer 14, and also receives the output of PLL 20 itself, and generates an error voltage based on the difference between the two inputs. The output of phase detection circuit 22, as is conventional in PLLs, is filtered by low pass filter 24, and applied to the input of voltage controlled oscillator (VCO) 26. VCO 26 presents at the output of PLL 20, which is the output of clock buffer circuit 10, a square wave signal having a frequency corresponding to the voltage applied to the input of VCO 26. Since the voltage applied to the input of VCO 26 is the output of phase detection circuit 22, which compares the output of buffer 14 to the output of VCO 26, the operation of VCO 26 is phase-locked to the output of buffer 14. For example, if the output of buffer 14 leads the output of VCO 26, the error voltage of phase detection circuit 22 will be relatively high, such that VCO 26 is advanced to catch up to the output of buffer 14; conversely, if the output of buffer 14 lags the output of VCO 26, the error voltage of phase detection circuit 22 will be relatively low, such that VCO 26 is retarded to allow the output of buffer 14 to catch up.

As is conventional for PLLs, phase detection circuit 22 responds to the rising edges of the input signal applied thereto, and generates its error voltage accordingly so that, after filtering by low pass filter 24, the voltage applied to VCO depends on the phase difference between its two inputs. VCO 26, as is conventional, operates with a fixed duty cycle which, in this example where high speed digital logic circuits are controlled by the square wave output of VCO 26, is 50%.

Figure 2:
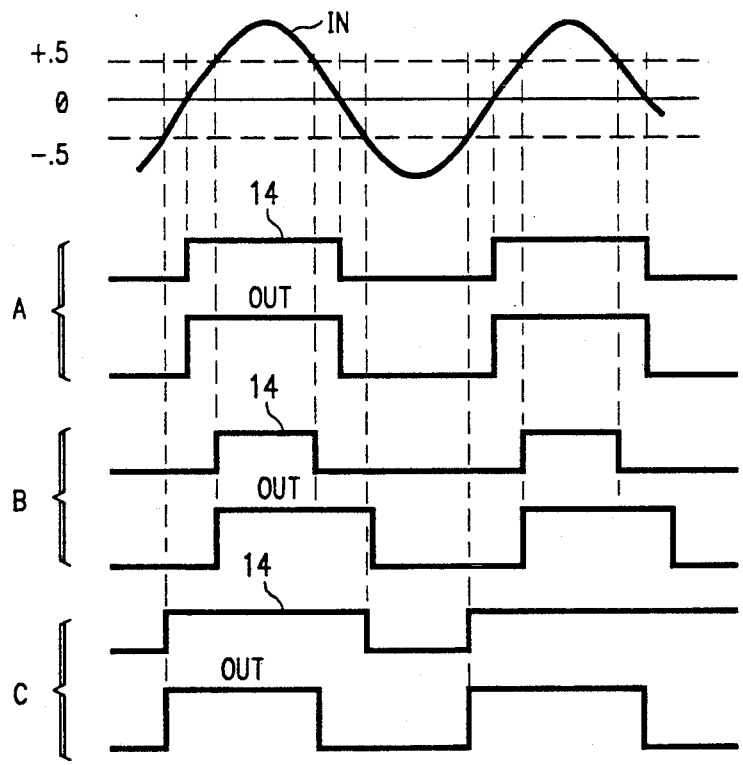
FIG. 2 is a timing diagram illustrating the operation of the circuit of FIG. 1.

Referring now to FIG. 2, a timing diagram is shown illustrating the operation of clock buffer circuit 10 in providing adjustable delay with a fixed duty cycle, useful for the purposes described hereinabove. Input sine wave clock signal IN is shown in FIG. 2 as normalized (each peak being 1.0 or $-1.0$, depending on polarity), and with crossing voltages of 0, $+0.5$ and $-0.5$. The adjustment of the propagation delay through clock buffer circuit 10, together with the fixed duty cycle at the output thereof, will now be described relative to three cases, namely cases A, B and C shown in FIG. 2.

Case A of FIG. 2 illustrates the operation of clock buffer circuit 10 in the example where variable reference 18 sets the switching level of buffer 14 at 0.0, i.e., the midpoint amplitude of the sine wave at terminal IN. With the switching level at 0.0, buffer 14 drives a low-to-high transition at its output (shown by line 14 in FIG. 2) responsive to input sine wave IN crossing the switching level (i.e., exceeding the voltage applied to the inverting input by variable reference 18) in a rising direction; similarly, as the voltage of input sine wave IN crosses the switching level in a falling direction, buffer 14 drives a high-to-low transition at its output.

Responsive to the rising edge of the output of buffer 14, PLL 20 will cause a low-to-high transition at its output (shown as line OUT in FIG. 2). In the conventional manner for PLL 20, the output of VCO 26 in PLL 20 is applied to phase detection circuit 26, such that the frequency of VCO 26 is adjusted in order for the output of PLL 20 to be phase synchronous with the input to PLL 20. Since input sine wave IN is periodic, and relatively stable in frequency and phase, over a number of cycles the output of PLL 20 will thus become phase synchronous with its input (i.e., the output of buffer 14), as shown in FIG. 2. As noted hereinabove, PLL 20 provides a 50% duty cycle output, with the rising edge of the output phase synchronous with its input, as shown in case A of FIG. 2.

Referring now to case B, the operation of clock buffer circuit 10 with a lagging delay will now be described. Case B illustrates the operation where variable reference 18 is adjusted in such a manner as to present a higher voltage at the inverting terminal of buffer 14 than in case A; for purposes of example, case B has the switching level set at +0.5, for the normalized input sine wave IN. At such time as input sine wave IN rises above the switching level of +0.5, buffer 14 generates a low-to-high transition at its output, and applies it to the input of PLL 20. In the same manner as described hereinabove, PLL 20 generates a 50% duty cycle square wave at its output OUT which is phase synchronous with the rising edge of the output of buffer 14. As is evident from a comparison of case B with case A, square wave output OUT in case B is delayed from square wave output OUT in case A, with both cases exhibiting a 50% duty cycle square wave.

The duty cycles of square wave outputs OUT in cases A and B are both at 50% since the duty cycle depends only on the implementation and setup of PLL 20, and not on the duty cycle of the input to PLL 20, as is well known in the art. Accordingly, event though the duty cycle of the output of buffer 14 is less in case B than in case A, the duty cycle of the output of clock buffer circuit 10 in each case remains fixed. The delay in the rising edge of the output of buffer 14 in case B, relative to that in case A, thus adjusts the propagation delay through clock buffer circuit 10 with no effect on the duty cycle.

Referring now to case C of FIG. 2, variable reference 18 is adjusted in such a manner that a relatively low voltage is applied to the inverting input of buffer 14, resulting in a switching level of −0.5 (on the normalized scale). Buffer 14, operating in a manner similar as described hereinabove, presents a square wave at its output having a duty cycle greater than 50%, since the duration of input sine wave IN above the switching level of −0.5 is greater than its duration below the switching level. This causes the rising edge of the output of PLL 20 in case C to be advanced from that in cases A and B; as in the other cases, the duty cycle of the square wave output OUT remains substantially at 50%, due to the configuration of PLL 20.

It should thus be evident that variations in the voltage applied to the inverting input of buffer 14 will vary the phase of the output of buffer 14, and of the output of PLL 20, relative to the phase of sine wave input IN, with little or no variation in the duty cycle of the output of PLL 20 occurring because of such variation. The variation in relative phase thus can adjust the propagation delay of the clock signal through clock buffer circuit 10. With multiple clock buffer circuits 10 in a computer system, the adjustability of the delay allows for matching of the propagation delays of the multiple clock buffer circuits 10 to one another; it is contemplated that the maximum variation between clock buffer circuits 10 constructed according to this embodiment of the invention can be limited to within 1 nsec, using current technology. This close matching of the propagation delays by clock buffer circuit 10 allows the use of high frequency system clocks in a computer system without being subject to errors caused by clock signal skew within the system. Furthermore, the ability to adjust the propagation delays facilitates the use of sine wave clock signal communication through most of the system which, as described in application Ser. No. 444,116, reduces the harmonic noise in the system.

It should be noted that it is preferable that clock buffer circuit 10 of FIG. 1 be constructed as a custom or semi-custom integrated circuit, for example as a gate array, standard cell arrangement, or other application specific integrated circuit (ASIC). In such construction, of course, variable reference 18 would most easily be provided as a voltage divider with trimmable resistors thereon, or may alternatively be provided externally to the integrated circuit. Construction of clock buffer circuit 10 on a monolithic integrated circuit would, of course, reduce parasitic and other undesirable effects which arise from the interconnection of discrete elements with one another.

Figure 3:
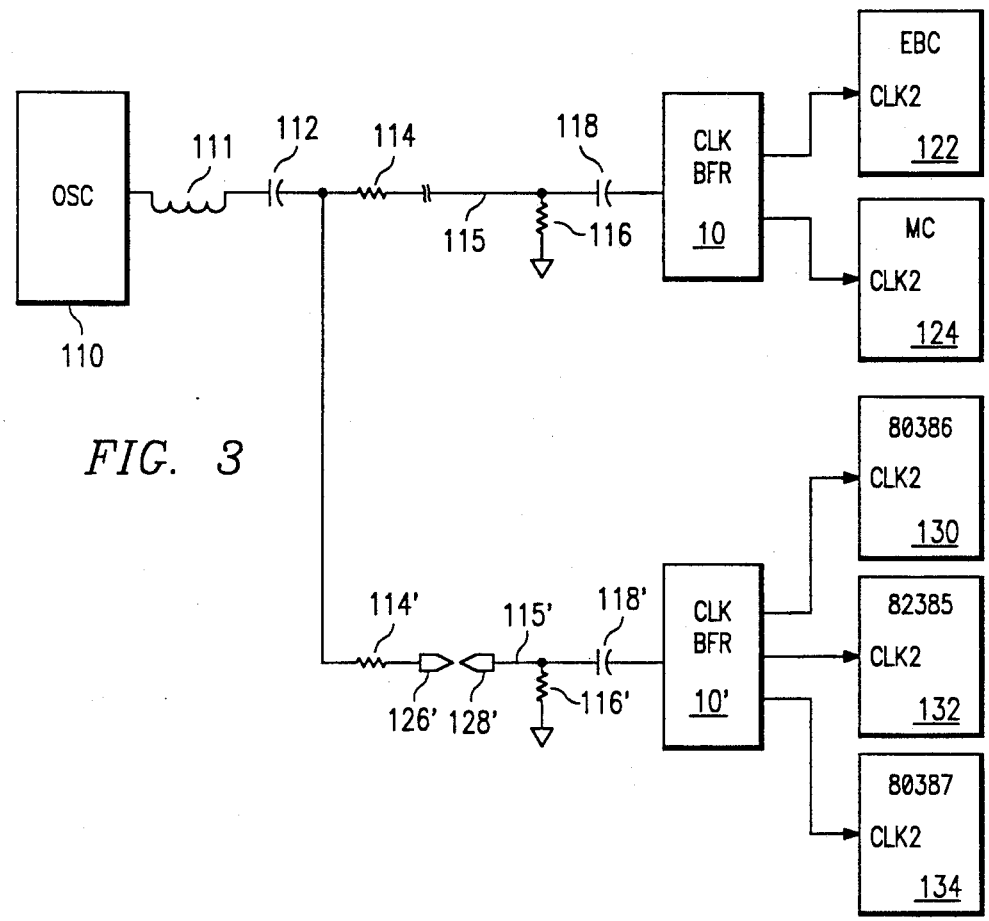
FIG. 3 is an electrical diagram, in schematic form, of a exemplary implementation of the circuit of FIG. 1.

Referring now to FIG. 3, a clock distribution system in a high speed computer system will now be described. The system of FIG. 3 is substantially as described in said copending application Ser. No. 444,116, cited and incorporated by reference hereinabove. Oscillator 110 is a conventional oscillator which produces a square wave at its output; in the conventional manner, inductor 111 and capacitor 112, connected in series with the output of oscillator 110, together with resistors 114 and 114′ for the various distribution legs of the system, communicate a sine wave clock signal throughout the computer system.

As noted in said copending application Ser. No. 444,116, the communication of the clock signal in the form of a sine wave rather than a square wave is advantageous, particularly at high frequencies on the order of tens of MHz, as far less harmonic noise is generated by the sine wave. In the system of FIG. 3, the sine wave is communicated along leg 115, terminated by a high pass filter of resistor 116 (connected between leg 115 and ground) and series capacitor 118. This filter blocks any DC portion of the clock signal which may have been induced during its communication. Clock buffer 10 according to this invention receives the filtered sine wave clock signal, and generates the square wave output clock signals applied to clocked circuits in the system. For example, the outputs of clock buffer 10 are connected to the CLK2 inputs of an EISA bus controller 122, such as the one manufactured and sold by Intel Corporation under the part number 82358, and of a memory controller 124. Similarly, the sine wave clock signal may be communicated to leg 115', passing through connector pins 126' and 128', to clock buffer 10' also constructed according to this invention. Similarly as for leg 115, the DC components of the sine wave clock signal are filtered in leg 115' by resistor 116' and capacitor 118'. Clock buffer 10' communicates a square wave output signal in the manner described hereinabove to additional clocked circuits, such as microprocessor 130 (e.g., the 80386 manufactured and sold by Intel Corporation), cache memory controller 132 (e.g., the 823385 manufactured and sold by Intel Corporation), and math co-processor 134 (e.g., the 80387 manufactured and sold by Intel Corporation).

The advantage of clock buffer 10 according to this invention are particularly useful in a system such as shown in FIG. 3, where multiple clock buffers 10 and 10' are used to provide clock signals to multiple clocked circuits which must operate synchronously with one another. Particularly in high speed computers, relatively small differences (i.e., on the order of 4 nsec) in the timing of the clock signals applied to the circuits can cause faulty operation of the computer system. Where multiple conventional clock buffers are used in a system such as shown in FIG. 3, manufacturing variations can easily cause propagation delay differences among such circuits of sufficient degree to cause errors in high speed computer systems. Since clock buffer circuit 10 according to the invention allows adjustment of the propagation delays without affecting the duty cycle of the output, its implementation allows the clocked circuits in a system such as shown in FIG. 3 to operate synchronously at high frequencies. Such a system also benefits from the advantages of sine wave clock signal distribution as described in said application Ser. No. 444,116.

Figure 4:
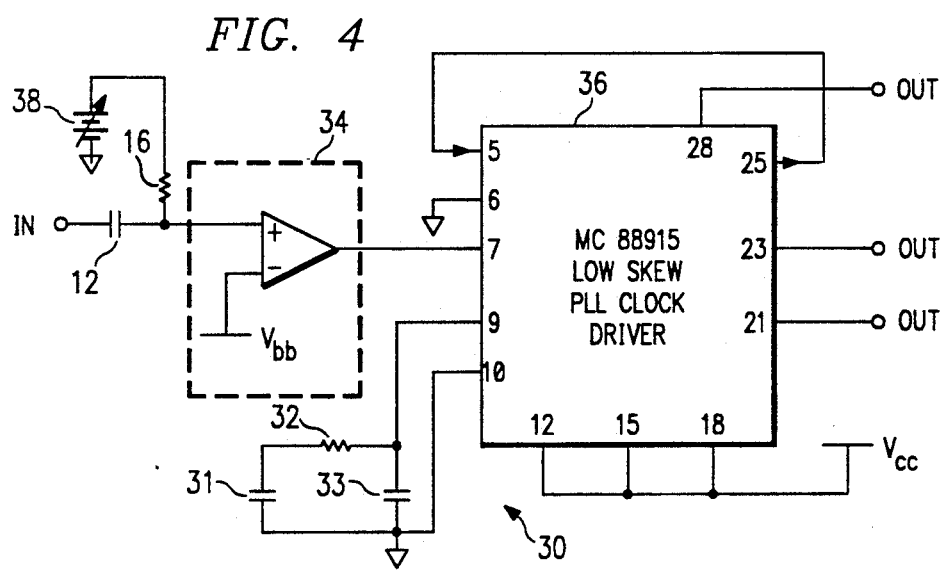
FIGS. 4 through 6 are electrical diagrams, in schematic form, of alternative embodiments of the invention.

FIG. 4 illustrates clock buffer circuit 30 according to a second embodiment of the invention, utilizing a combination of discrete elements. Terminal IN receives the input clock signal, preferably a sine wave, as described hereinabove for the embodiment of FIG. 1; the input clock signal is capacitively coupled by capacitor 12, as in the case hereinabove. Differential buffer 34 receives the capacitively coupled input clock signal at a non-inverting input, with a DC bias applied thereto by variable power supply 38 connected through pull-up resistor 16. The voltage at the inverting input of buffer 34 is internally generated and remains at a fixed voltage. For example, buffer 34 may be implemented as one of the translators of the MC10125 quad ECL to TTL translator, as noted hereinabove; for this translator, the inverting input is connected to pin 1, which is the output of an internally generated $V_{bb}$ voltage having a value nominally at $-1.2$ volts. Also in the case of the MC10125 translator, the $V_{cc}$ and $V_{ee}$ bias voltage are applied at the suggested values.

In this embodiment, the output of buffer 34 is connected to a sync input of a PLL clock driver circuit 36; in the example of FIG. 4, circuit 36 is the MC88915 low skew PLL clock driver circuit noted hereinabove, and for which the pin assignments will be described hereinbelow. The sync input of circuit 36 receiving the output of buffer 36 is pin 7 of the MC88915. Circuit 36 is implemented in conventional fashion to drive, at its multiple outputs, a square wave clock signal of 50% duty cycle which is phase synchronous with the signal applied to its sync input. In this example, the desired output clock signal from circuit 36 is at twice the frequency of the signal applied to its sync input. The MC88915 used in this example for circuit 36 has its Q/2 output at pin 25 connected to its feedback input of pin 5; as a result, a 16.7 MHz input sine wave clock signal will produce a 33 MHz output square wave signal at the various outputs of circuit 36 such as pins 28, 21 and 23. Operation of the MC88915 used as circuit 36 is enabled by biasing the FREQ_SEL input at pin 12 and the PLL_EN input at pin 18 to $V_{cc}$ (pin 15). The low pass filter between the phase detection portion of the MC88915 and the VCO therein is externally provided between pins 9 and 10, by capacitors 31 and 33 and resistor 32, connected in the conventional configuration and using the values suggested by the manufacturer of circuit 36.

In operation, clock buffer circuit 30 produces a square wave output at the outputs of circuit 36 which is at twice the frequency of the input sine wave clock signal received at terminal IN. The delay of clock buffer circuit 30 is controlled by the voltage of variable power supply 38. For the output of circuit 36 to be phase synchronous with the input sine wave (i.e., rising edge of the output synchronous with a zero crossing point of the input sine wave clock signal), the nominal value of variable power supply 36 is on the order of 1.2 volts. Adjustment of the DC offset applied to the non-inverting pin of buffer 34 will adjust the switching level of buffer 34, in similar manner as described hereinabove relative to FIG. 2.

The square wave clock signal output of circuit 36 thus has its delay adjusted according to the value of variable power supply 38, but maintains a 50% duty cycle regardless of the value of the adjusted delay. It should be noted that the range of delays over which the adjustments may take place is the full peak-to-peak range of the input sine wave signal, and thus the propagation delay adjustment time range is the full 360° range of the period of the input clock signal. As a result, multiple clock buffer circuits 30 may be provided within a system, similarly as discussed above relative to FIG. 3, with the delays through each adjusted so that the relative skew of the clock signals applied to the clocked circuit is minimal.

Figure 5:
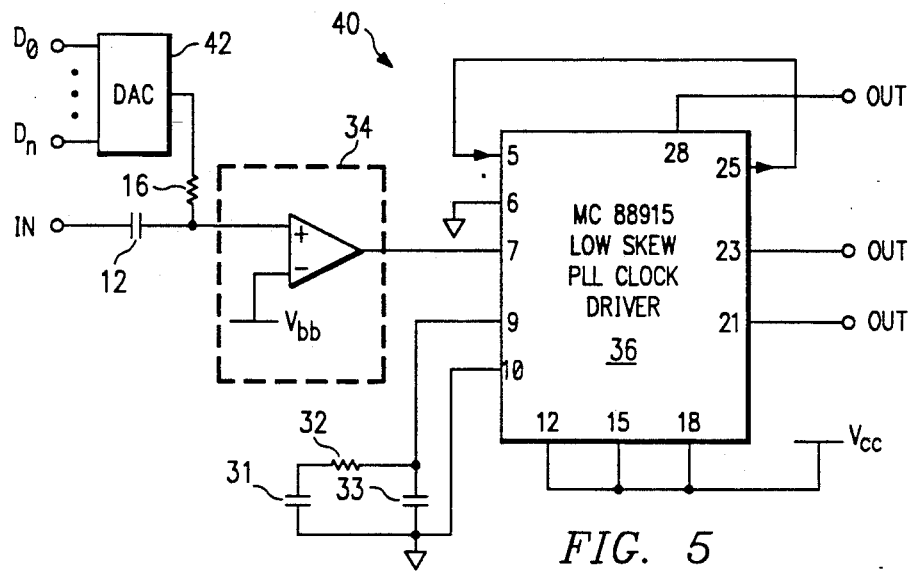

Referring now to FIG. 5, clock buffer circuit 40 according to another embodiment of the invention will now be described. Clock buffer circuit 40 includes buffer 34 and circuit 36, configured in similar manner as described above relative to clock buffer circuit 30. In place of variable power supply 38 of clock buffer circuit 30, clock buffer circuit 40 controls the offset DC bias applied to the non-inverting input of buffer 34 (through pull-up resistor 16) by way of digital-to-analog converter (DAC) 42.

DAC 42 receives a digital word at its inputs $D_0$ through $D_n$, and presents an analog voltage at its output corresponding to the value of the digital word received thereat. The output analog voltage from DAC 42 provides the offset DC bias to the non-inverting input of buffer 34, and accordingly controls the propagation delay through clock buffer circuit 40. Implementation of clock buffer circuit 40 in a digital computer system thus allows program control of the propagation delay of the clock signal through clock buffer circuit 40, as a digital word may be generated by the central processing unit of the computer system itself to control its own clock delay. A register, latch, or other storage circuit (not shown) for maintaining the value of the digital word applied to DAC 42 may also be implemented as desired in the computer system.

Figure 6:
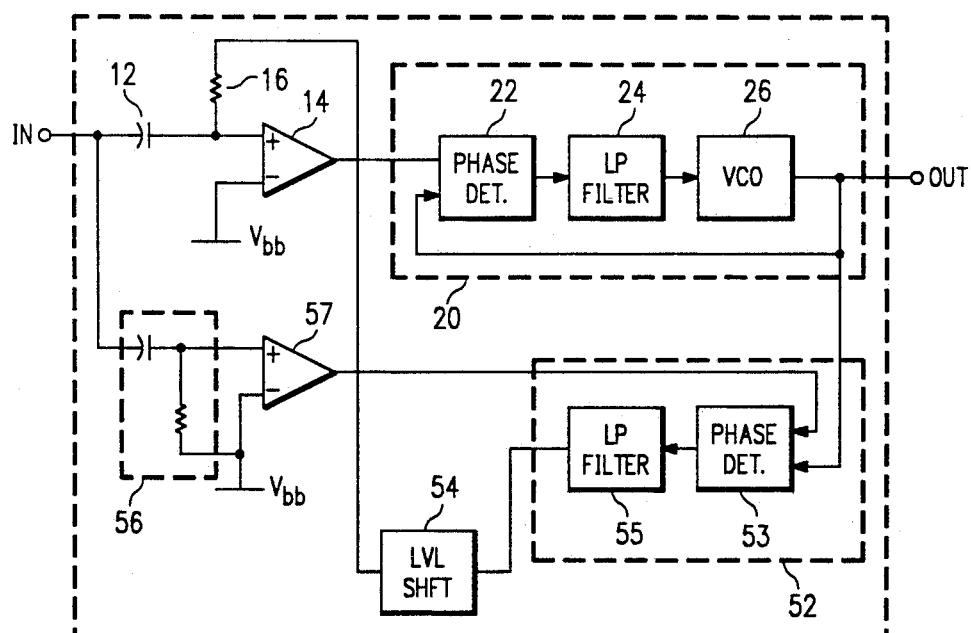

It is contemplated that the DC offset bias to the clock buffer circuit according to this invention may also be controlled in a self-calibrating manner, as will be described relative to another embodiment of the invention, illustrated in FIG. 6. Clock buffer circuit 50 includes a buffer 14 and first PLL 20 as described hereinabove, with a DC offset provided to the high pass filter of resistor 16 and capacitor 12 to the non-inverting input of buffer 14; the inverting input of buffer 14 is coupled to a reference voltage, for example $V_{bb}$. Clock buffer circuit 50 also includes a phase detector 53 and a low pass filter 55 (which may be incorporated into a second PLL 52 constructed similarly as PLL 20, but in which the VCO will not be used). One input of phase detector 53 receives the output of VCO 26 of PLL 20. The output of phase detector 53, filtered by low pass filter 55, is connected to resistor 16 via level shifter 54.

Also in this embodiment, the input clock signal at terminal IN is coupled to the second input of phase detector 53 via buffer 57, which is similar to buffer 14 receiving the input clock signal. The non-inverting input of buffer 57 receives the input clock signal from terminal IN via high pass filter 56, similarly constructed as the filter of capacitor 12 and resistor 16, and which is biased to a reference voltage such as $V_{bb}$. The inverting input of buffer 57 is biased to the same reference voltage as buffer 14, which in this example is also $V_{bb}$. As a result, the second input to phase detector 53 receives a signal which is derived from the input clock signal, but which switches relative to a fixed voltage; in this example, the switching level of buffer 57 is at the zero crossing point.

Accordingly, the error voltage generated by phase detector 53 corresponds to the phase difference between the input clock signal at terminal IN and the signal at the output of PLL 20 (it should be noted, of course, that the connection of the two inputs to phase detector 53 must be done in such a manner as to provide negative feedback, rather than positive feedback). Level shifter 54 is a conventional circuit, for example implemented via an operational amplifier, which shifts the error voltage from phase detector 53 to a level compatible with the operation of buffer 14. As a result, the error voltage from PLL 52, in this embodiment, controls the DC offset applied to the input clock signal at the non-inverting terminal of buffer 14, and thus controls the switching level of buffer 14, and the delay through input clock buffer 50.

As a result, clock buffer circuit 50 may be set to self-calibrate to a particular delay, depending on the shift provided by level shifter 54, including the condition where the output of clock buffer circuit 50 is phase-synchronous with the input clock signal. The self-calibration feature of clock buffer circuit 50 would eliminate the need to tune each of the clock buffer circuits 50 in a system, and thus would facilitate the manufacturing process.

It is contemplated that other techniques for controlling and adjusting the propagation delay through the clock buffer circuit of this invention will now be apparent to those of ordinary skill in the art having reference to this specification. While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clock buffer circuit, comprising:
   an input buffer, having a first input for receiving an input clock signal, having a second input for receiving a reference signal, and having an output, said input buffer for presenting a signal at its output corresponding to the amplitude of the input clock signal relative to the reference signal applied to said second input;
   a phase locked loop, having an input coupled to the output of said input buffer, and having an output, said phase locked loop for presenting a periodic signal at a predetermined duty cycle which is phase synchronous with the output of said input buffer; and
   means, coupled to said input buffer, for adjusting the relationship between said input clock signal and said reference signal to adjust a delay time between said input clock signal and said periodic signal.

2. The circuit of claim 1, wherein said input clock signal is a sinusoidal signal.

3. The circuit of claim 2, further comprising:
   a capacitor coupled to said first input of said input buffer so that the input clock signal is capacitively coupled to said first input of said input buffer.

4. The circuit of claim 2, wherein said periodic signal is a square wave.

5. The circuit of claim 1, wherein said input buffer has a first input for receiving said input clock signal and a second input for receiving a reference signal;
   and wherein said input buffer presents a signal at its output corresponding to the relative amplitudes of the signals at its first and second inputs.

6. The circuit of claim 5, wherein said means for adjusting comprises:
   a voltage divider, biased between a power supply voltage and a reference voltage, and having a tap coupled to said second input of said input buffer.

7. The circuit of claim 6, wherein said tap of said voltage divider is adjustable, so that the voltage applied to said second input of said input buffer is adjustable.

8. The circuit of claim 1, wherein said means for adjusting comprises:
   means for applying a variable bias voltage to said input of said input buffer, for providing a DC offset to said input clock signal.

9. The circuit of claim 8, wherein said means for applying comprises:
   a digital-to-analog converter, for receiving a digital word corresponding to the desired variable bias voltage, and for providing a DC offset to said input clock signal responsive thereto.

10. The circuit of claim 1, wherein said means for adjusting comprises:
    a phase detector having a first input coupled to the output of said phase locked loop, having a second input receiving said input clock signal, and having an output coupled to said input buffer for adjusting said reference signal according to the phase difference between said output of said phase locked loop and said input clock signal.

11. The circuit of claim 10, wherein the output of said phase detector is coupled to said input buffer in such a manner that said output of said phase locked loop and said input clock signal are controlled to be phase synchronous.

12. A computing system, comprising:

first and second clocked circuits, each having a clock input;

a first clock buffer circuit, having an input for receiving an input clock signal, and having an output coupled to said clock input of said first clocked circuit, said first clock buffer circuit having a propagation delay therethrough; and a second clock buffer circuit comprising:

an input buffer having a first input for receiving said input clock signal, having a second input for receiving a reference signal, and having an output for presenting a signal corresponding to the amplitude of the input clock signal relative to said reference signal;

a phase locked loop, having an input coupled to the output of said input buffer, and having an output coupled to said clock input of said second clocked circuit, said phase locked loop for presenting a periodic signal at a predetermined duty cycle which is phase synchronous with the output of said input buffer; and means, coupled to said input buffer, for adjusting the relationship between said input clock signal and said reference signal to adjust a delay time between said input clock signal and said periodic signal to match the propagation delay of said first clock buffer circuit.

13. The system of claim 12, wherein said first and second clocked circuits operate synchronously with one another.

14. The system of claim 13, further comprising:

means for generating said input clock signal and applying it to said first and second clock buffer circuits.

15. The system of claim 14, wherein said generating means generates a sine wave as said input clock signal.

16. The system of claim 13, wherein said first clock buffer circuit comprises:

an input buffer, having a first input for receiving said input clock signal, having a second input for receiving a reference signal, and having an output for presenting a signal corresponding to the amplitude of the input clock signal relative to said reference signal;

a phase locked loop, having an input coupled to the output of said input buffer, and having an output coupled to said clock input of said first clocked circuit, said phase locked loop for presenting a periodic signal at a predetermined duty cycle which is phase synchronous with the output of said input buffer; and means, coupled to said input buffer, for adjusting the relationship between said input clock signal and said reference signal to adjust the propagation delay between said input clock signal and said periodic signal.

17. The system of claim 13, wherein said input buffer of said second clock buffer circuit has a first input for receiving said input clock signal and a second input for receiving a reference signal;

and wherein said input buffer presents a signal at its output corresponding to the relative amplitudes of the signals at its first and second inputs.

18. The system of claim 13, wherein said means for adjusting comprises:

means for applying a variable bias voltage to said input of said input buffer, for providing a DC offset to said input clock signal.

19. The system of claim 18, wherein said means for applying comprises:

a digital-to-analog converter, for receiving a digital word corresponding to the desired variable bias voltage, and for providing a DC offset to said input clock signal responsive thereto.

20. The system of claim 12, wherein said means for adjusting comprises:

a phase detector having a first input coupled to receive said periodic signal, having a second input coupled to receive said input clock signal, and having an output coupled to said input buffer for adjusting said reference signal according to the phase difference between said periodic signal and said input clock signal.

21. The system of claim 20, wherein the output of said phase detector is coupled to said input buffer in such a manner that said periodic signal and said input clock signal are controlled to be phase synchronous.

22. A method of operating a computer system which includes a plurality of clocked circuits useful in data processing and a clock buffer circuit, said clock buffer circuit having a phase locked loop for generating a periodic output signal synchronous with an input clock signal, comprising:

communicating a periodic input clock signal to a differential buffer, said differential buffer providing an output to said phase locked loop corresponding to the amplitude of said input clock signal relative to a switching level;

adjusting the point in the cycle at which said input clock signal crosses said switching level, to adjust the timing of the output signal from said differential buffer as applied to said phase locked loop; and applying the periodic output signal of said phase locked loop to one of said plurality of clocked circuits.

23. The method of claim 22, wherein said adjusting step comprises:

adjusting the DC bias of said input clock signal, relative to the DC switching voltage corresponding to said switching level.

24. The method of claim 22, wherein said computer system includes a plurality of clock buffer circuits;

and wherein said adjusting step is performed to one of said plurality of clock buffer circuits in order to substantially match its propagation delay with the propagation delay of another of said plurality of clock buffer circuits.

25. The method of claim 22, wherein said adjusting step comprises:

generating an error voltage corresponding to the phase difference between said output signal and said input signal; and adjusting said reference signal according to said error voltage, so that said propagation delay is adjusted according to the phase difference between said output signal and said input signal.

* * * * *